(12) United States Patent
Yao

(10) Patent No.: US 7,573,269 B2
(45) Date of Patent: Aug. 11, 2009

(54) METHOD AND APPARATUS FOR ACQUIRING MAGNETIC RESONANCE IMAGING DATA

(75) Inventor: Jiabin Yao, Beijing (CN)

(73) Assignee: GE Medical Systems Global Technology Company LLC., Waukesha, WI (US)

( * ) Notice: Subject to any disclaimer, the term of this patent is extended or adjusted under 35 U.S.C. 154(b) by 0 days.

(21) Appl. No.: 11/869,041

(22) Filed: Oct. 9, 2007

(65) Prior Publication Data
US 2008/0129290 A1    Jun. 5, 2008

(30) Foreign Application Priority Data
Nov. 30, 2006  (CN) .......................... 2006 1 0171864

(51) Int. Cl.
*G01V 3/00*   (2006.01)
(52) U.S. Cl. ....................................... 324/309; 324/307
(58) Field of Classification Search ................. 324/309, 324/307; 600/410, 415
See application file for complete search history.

(56) References Cited

U.S. PATENT DOCUMENTS 6,529,762 B1 *  3/2003  Ladebeck .................... 600/410
6,963,768 B2 * 11/2005  Ho et al. ..................... 600/415
7,346,383 B2 *  3/2008  Riederer et al. ............. 600/410

OTHER PUBLICATIONS

M. Zaitsev, C. Dold, J. Hennig, O. Speck, Title: Real Time Prospective Motion Correction for High Resolution in Vivo MRI Using an Optical Motion Tracking System, ISMRM 14, 2006, p. 2978.

* cited by examiner

*Primary Examiner*—Louis M Arana
(74) *Attorney, Agent, or Firm*—GE Global Patent Operation; Roger C. Phillips; William Fitzpatrick

(57) ABSTRACT

A method for generating a magnetic resonance image of a moving subject comprises tracking the position and orientation of a target volume and modifying acquisition parameters for each line of k-space data using current position and orientation information. By approximating the target volume as a rigid object, the current position and orientation is translated into an offset vector and a rotation which are used to modify the acquisition of each k-space line individually. The offset along a slice direction is compensated for by changing the transmit frequency. The offset along the frequency-encoding direction is compensated for by changing the frequency of a reference demodulation signal. The offset along the phase direction is compensated for by changing the phase of a reference demodulation signal, or by adding a phase into the line of k-space data after acquisition. The rotation is applied directly to the logical axes to change the angles between the logical axes and the physical axes of a magnetic resonance imaging system.

21 Claims, 4 Drawing Sheets

METHOD AND APPARATUS FOR ACQUIRING MAGNETIC RESONANCE IMAGING DATA

TECHNICAL FIELD

The present invention relates generally to magnetic resonance imaging (MRI) systems and in particular, to a method and apparatus for acquiring magnetic resonance imaging data from a moving patient.

BACKGROUND

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis", by convention). An MRI system also comprises components called gradient coils that produce smaller amplitude, spatially varying magnetic fields when current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. These coils are used to add energy to the nuclear spin system in a controlled fashion. As the nuclear spins then relax back to their rest energy state, they give up energy in the form of an RF signal. This signal is detected by the MRI system, and combined with multiple additional such signals may be used to reconstruct an MR image using a computer and known algorithms.

MR images may be created by applying currents to the gradient and RF coils according to known algorithms called "pulse sequences". A pulse sequence diagram may be used to show the amplitude, phase and timing of the various current pulses applied to the gradient and RF coils for a given pulse sequence. The selection of a pulse sequence determines the relative appearance of different tissue types in the resultant images, emphasizing or suppressing tissue types as desired. When a pulse sequence is "played out" (i.e., performed, or applied), multiple MR signals are acquired and stored for later reconstruction into an image. Higher resolution images require the collection of more MR signals than lower resolution images.

A pulse sequence uses information about the position and orientation of a target volume in the patient to be scanned that is provided by a scanner operator prior to the start of the pulse sequence. Typically, the scanner operator enters the position and orientation of the target volume using coordinates in the reference frame of the MR scanner (i.e., the coordinate system defined by the direction of the main magnet field and the gradient fields) and the scanner translates these physical coordinates into an "offset vector" and a rotation matrix. The offset vector gives the position of the target volume in logical space and the rotation matrix describes the orientation of the logical space relative to the physical space. Logical space is the coordinate system defined by the slice, frequency, and phase directions of the pulse sequence and may take on any orientation relative to the physical space. The word "offset" is used to describe the center position of the target volume, and refers to the offset of the target volume from the center of the MRI scanner, i.e., the center of the physical space. Information about the size of the target volume is also provided by the scanner operator. The target volume may be scanned using a pulse sequence corresponding to acquisition of a single slice, multiple slices, or a volume, or multiple volumes. Typically, each image is acquired using a single offset vector and rotation matrix. In an acquisition with multiple slices, each slice may each have its own unique offset vector and rotation matrix. For a stack of slices, or a volumetric acquisition, each slice (or image) shares a common rotation matrix and two elements of the offset vector, but the third element of the offset vector is unique to the slice.

For very fast pulse sequences, such as echo-planar imaging (EPI), sufficient data to reconstruct an image may be acquired in much less than one second. However, for most other pulse sequences, acquisition of sufficient data for an entire image requires longer than a minute. For most clinical imaging, multiple slices or a volume are obtained as a single image acquisition, which may take several minutes. Most pulse sequences and reconstruction algorithms are premised on an assumption that the target volume for imaging remains stationary during the image acquisition. Patient motion during the image acquisition may therefore result in image artifacts, and/or may degrade overall image quality. While the assumption of a stationary patient is usually valid for an EPI acquisition, it is not always reliable for longer acquisitions. Some patients are able to remain reasonably still while a pulse sequence is being played out, however, motion may present a significant challenge in pediatric patients, trauma patients, or patients who are unable to follow instructions to remain still. Accordingly, it would be desirable to provide a method and apparatus for acquiring MRI data while a patient is moving during the data acquisition period.

BRIEF DESCRIPTION OF THE INVENTION

In accordance with an embodiment, a method for generating a magnetic resonance image includes applying a magnetic field to a subject, receiving an initial position and an initial orientation of a target volume in the subject, determining a current position and a current orientation of the target volume before performing a portion of a pulse sequence corresponding to an acquisition of a single line of k-space data, modifying acquisition parameters for the portion of the pulse sequence using the current position and the current orientation of the target volume and acquiring the line of k-space data.

In accordance with another embodiment, a method for acquiring magnetic resonance data for a magnetic resonance image includes applying a magnetic field to a subject, receiving an initial position and an initial orientation of a target volume in the subject, the target volume associated with a plurality of k-space data, determining a current position and a current orientation of the target volume before performing a portion of a pulse sequence corresponding to an acquisition of a subset of lines of k-space data from the plurality of lines of k-space data, modifying acquisition parameters for the portion of the pulse sequence using the current position and the current orientation of the target volume and acquiring the subset of lines of k-space data.

In accordance with another embodiment, a computer-readable medium having computer-executable instructions for performing a method for generating a magnetic resonance image includes program code for program code for receiving an initial position and an initial orientation of a target volume in a subject, program bode for determining a current position and a current orientation of the target volume before performing a portion of a pulse sequence corresponding to an acquisition of a single line of k-space data, program code for modifying acquisition parameters for the portion of the pulse sequence using the current position and the current orientation of the target volume and program code for acquiring the line of k-space data.

In accordance with another embodiment, an apparatus for acquiring magnetic resonance data for a target volume in a subject, the target volume associated with a plurality of lines of k-space data includes a pulse generator configured to receive a current position and a current orientation of the target volume before acquisition of each line of k-space data in the plurality of lines of k-space data, the acquisition of each line of k-space data performed in accordance with a portion of a pulse sequence having a set of acquisition parameters, the pulse generator further configured to modify the set of acquisition parameters based on the current position and current orientation of the target volume before acquisition of each line of k-space data and a magnetic resonance imaging assembly coupled to the pulse generator and configured to acquire each line of k-space data in accordance with the modified set of acquisition parameters corresponding to the line of k-space data.

BRIEF DESCRIPTION OF THE DRAWINGS

Embodiments are illustrated by way of example and not limitation in the accompanying drawings, in which like reference numerals indicate corresponding, analogous or similar elements, and in which.

DETAILED DESCRIPTION

In the following detailed description, numerous specific details are set forth in order to provide a thorough understanding of embodiments. However it will be understood by those of ordinary skill in the art that the embodiments may be practiced without these specific details. In other instances, well-known methods, procedures, components and circuits have not been described in detail so as not to obscure the embodiments.

MRI data is typically collected in a Fourier space known in imaging as "k-space," a reciprocal space connected to real space via a Fourier transform. Each line of MRI data in k-space corresponds to a MR signal that has been encoded with a particular spatial frequency and acquired and digitized. In accordance with embodiments, an offset vector and rotation matrix may be determined for each k-space line individually during the acquisition of MRI data. The ability to define different offset vectors and rotation matrices for each k-space line allows tracking of an acquired slice or volume with a moving target volume. Updated position and orientation information for the target volume is used to help define the offset vector and rotation matrix for each line of k-space data. The updated position and orientation information for the target volume relative to the main magnet's coordinate system may be provided using a tracking device external to the patient. Accordingly, k-space data corresponding to the same target volume may be continually acquired throughout the image acquisition, even while the patient (and target volume) is moving.

Figure 1:
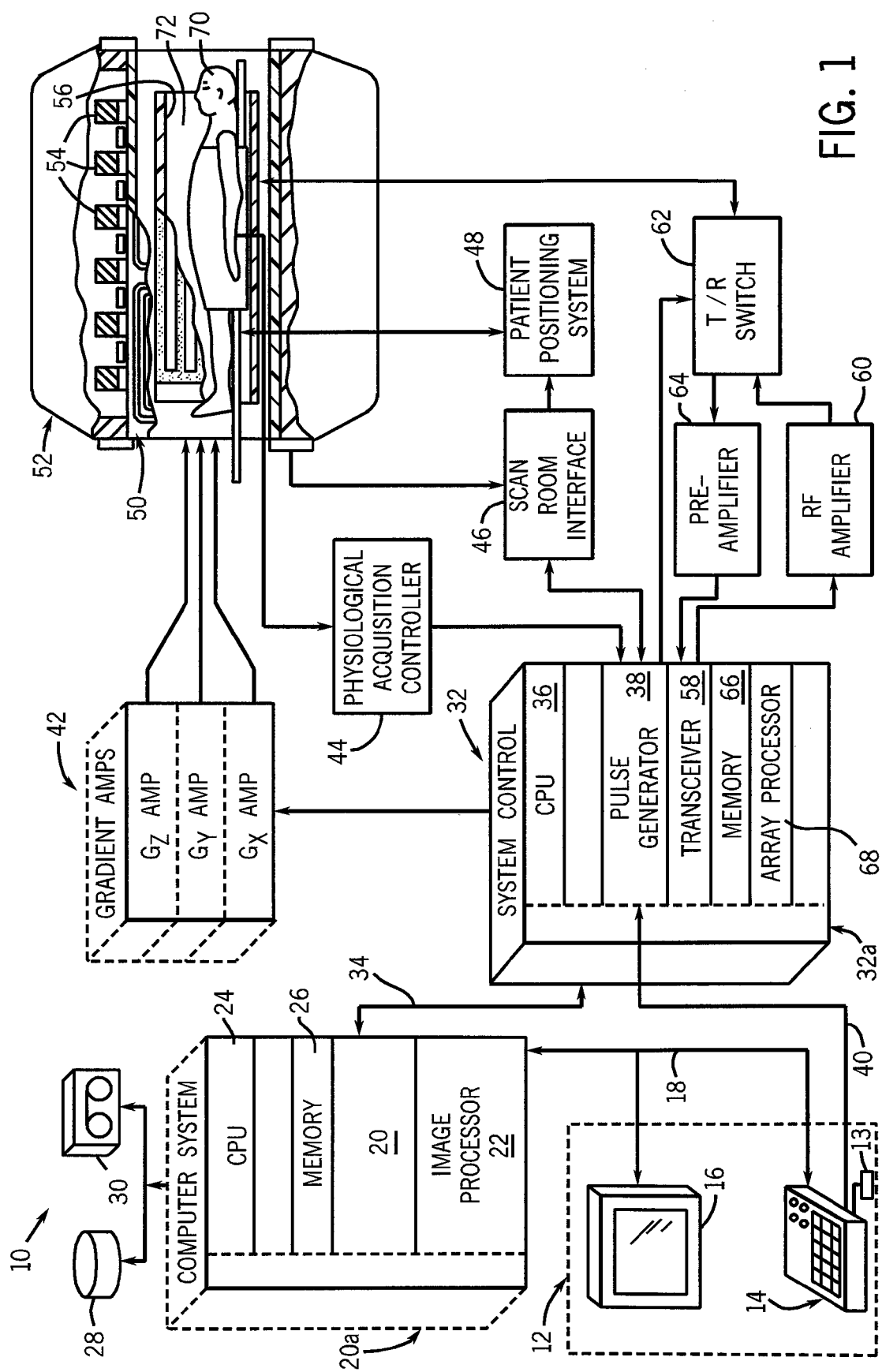
FIG. 1 is a schematic block diagram of an exemplary magnetic resonance imaging system in accordance with an embodiment.

FIG. 1 is a schematic block diagram of an exemplary magnetic resonance imaging system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display the resultant images, perform image processing on the images, and archive data and images. The computer system 20 includes a number of modules that communicate with each other through electrical and/or data connections, for example such as are provided by using a backplane 20a. Data connections may be direct-wired links, or may be fiber optic connections or wireless communication links or the like. These modules include an image processor module 22, a CPU module 24 and a memory module 26. Memory module 26 may be, for example, a frame buffer for storing image data arrays as known in the art. In an alternative embodiment, the image processor module 22 may be replaced by image processing functionality on the CPU module 24. The computer system 20 is linked to archival media devices, such as disk storage 28 and tape drive 30 for storage of image data and programs, and communicates with a separate system control computer 32 through a high speed serial link 34. Archival media include but are not limited to: random access memory (RAM), read-only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium which may be used to store the desired instructions and which can be accessed by computer system 20, including by internet or other computer network forms of access. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct-wired links, or may be fiber optic connections or wireless communication links or the like. In alternative embodiments, the modules of computer system 20 and system control computer 32 may be implemented on the same computer systems or a plurality of computer systems. The modules of system control computer 32 include a CPU module 36 and a pulse generator module 38 that connects to the operator console 12 through a communications link 40. It is through link 40 that the system control computer 32 receives commands from the operator to indicate the scan sequence that is to be performed. The pulse generator module 38 operates the system components that play out (i.e., perform) the desired pulse sequence and produces data called radio frequency (RF) waveforms which control the timing, strength and shape of the RF pulses to be used, and the timing and length of the data acquisition window. The pulse generator module 38 connects to a gradient amplifier system 42 and produces data called gradient waveforms which control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of Gx, Gy and Gz amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a magnet assembly 52 that includes a polarizing magnet 54 and a whole-body RF coil 56. A patient or imaging subject 70 may be positioned within a cylindrical imaging volume 72 of the magnet assembly 52. A transceiver module 58 in the system control computer 32 produces pulses that are amplified by an RF amplifier 60 and coupled to the RF coils 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the coil during the receive mode. The transmit/receive switch 62 can also enable a separate RF coil (for example, a surface coil) to be used in either the transmit or receive mode.

The MR signals sensed by the RF coil 56 are digitized by the transceiver module 58 and transferred to a memory module 66 in the system control computer 32. MRI data is typically collected in a Fourier space known in imaging as "k-space", a reciprocal space connected to real space via a Fourier transform. Each MR signal is encoded with a particular spatial frequency using "phase-encoding" gradient pulses, and multiple such MR signals are digitized and stored in k-space for later reconstruction as an image. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the high speed link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on display 16.

Figure 2:
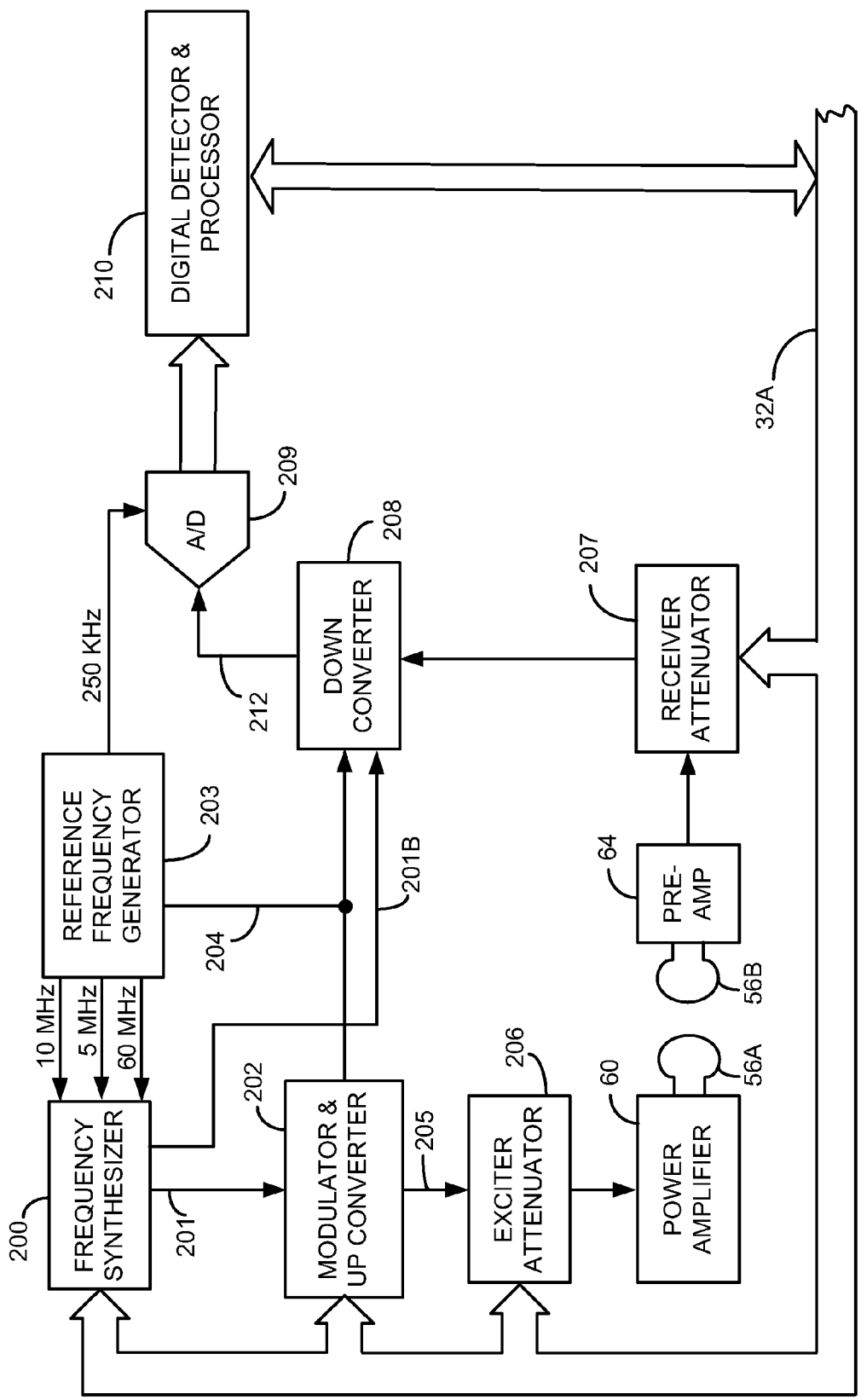
FIG. 2 is an electrical block diagram of a transceiver which may be used in the exemplary magnetic resonance imaging system of FIG. 1.

FIG. 2 is an electrical block diagram of an exemplary transceiver which may be used in the exemplary magnetic resonance imaging system of FIG. 1. Referring to FIGS. 1 and 2, the transceiver module 58 includes components which produce an RF excitation field through power amplifier 60 at a transmit coil 56A and components which receive the resulting MR signal induced in a receive coil 56B. As indicated above, the coils 56A and 56B may be a single whole-body coil that may be used to transmit and receive, but alternatively, a local RF coil may also be used to transmit and/or receive. The base, or carrier, frequency of the RF excitation field is produced under control of a frequency synthesizer 200 which receives a set of digital signals through the backplane 32A from the CPU module 36 and pulse generator module 38. These digital signals indicate the frequency and phase of the RF carrier signal which is produced at an output 201. The commanded RF carrier is applied to a modulator and up converter 202 where its amplitude is modulated in response to a signal R(t) also received through the backplane 32A from the pulse generator module 38. The signal R(t) defines the envelope, and therefore the bandwidth, of the RF excitation pulse to be produced. R(t) is produced in the pulse generator module 38 by sequentially reading out a series of stored digital values that represent the desired envelope. These stored digital values may, in turn, be changed to enable any desired RF pulse envelope to be produced. The modulator and up converter 202 produces an RF pulse at the desired frequency at an output 205. The magnitude of the RF excitation pulse output through line 205 is attenuated by an exciter attenuator circuit 206 which receives a digital command, (i.e., Transmit Attenuation, TA), from the backplane 32A. The attenuated RF excitation pulses are applied to the power amplifier 60 that drives the RF coil 56A.

Referring still to FIGS. 1 and 2, the MR signal produced by the subject 70 is picked up by the receiver coil 56B and applied through the preamplifier 64 to the input of a receiver attenuator 207. The receiver attenuator 207 further amplifies the MR signal and this is attenuated by an amount determined by a digital attenuation signal (i.e., Receive Attenuation, RA), received from the backplane 32A. The receive attenuator 207 is also turned on and off by a signal from the pulse generator module 38 such that it is not overloaded during RF excitation. The received MR signal is at or around the Larmor frequency, which, for example, is 63.86 MHz at 1.5 Tesla. This high frequency signal is down converted in a two-step process by a down converter 208 which first mixes the MR signal with a reference demodulation signal on line 201B and then mixes the resulting difference signal with the a reference signal, for example, a 2.5 MHz reference signal, on line 204. In this example, the resulting down-converted MR signal on line 212 has a maximum bandwidth of 125 kHz and it is centered at a frequency of 187.5 kHz. The down-converted MR signal is applied to the input of an analog-to-digital (A/D) converter 209 which samples and digitizes the analog signal at a rate of, for example, 250 kHz. The output of the A/D converter 209 is applied to a digital detector and signal processor 210 which produce 16-bit in-phase (I) values and 16-bit quadrature (Q) values corresponding to the received digital signal. The resulting stream of digitized I and Q values of the received MR signal is output through backplane 32A to the memory module 66 where they may be accessed to reconstruct an image. The reference demodulation signal 201B may be the same carrier signal at the output 201, or it may be shifted in frequency or in phase relative to the carrier signal at the output 201.

To preserve the phase information contained in the received MR signal, both the modulator and up-converter 202 in the exciter section and the down-converter 208 in the receiver section are operated with common signals. More particularly, the carrier signal at the output 201 of the frequency synthesizer 200 and the 2.5 MHz reference signal at the output 204 of the reference frequency generator 203 are employed in both frequency conversion processes. Typically, the carrier signal at the output 201 is used directly as the reference demodulation signal 201B. Phase consistency is thus maintained and phase changes in the detected MR signal accurately indicate phase changes produced by the excited spins. However, to shift the image field of view in the read direction or the phase direction, the frequency or the phase of the reference demodulation signal 201B respectively may be shifted by an amount necessary to produce the desired field of view shift. The 2.5 MHz reference signal as well as 5, 10 and 60 MHz reference signals are produced by the reference frequency generator 203 from a common master clock signal, for example, 20 MHz master clock signal. The latter three reference signals are employed by the frequency synthesizer 200 to produce the signals at outputs 201 and 201B.

Figure 3:
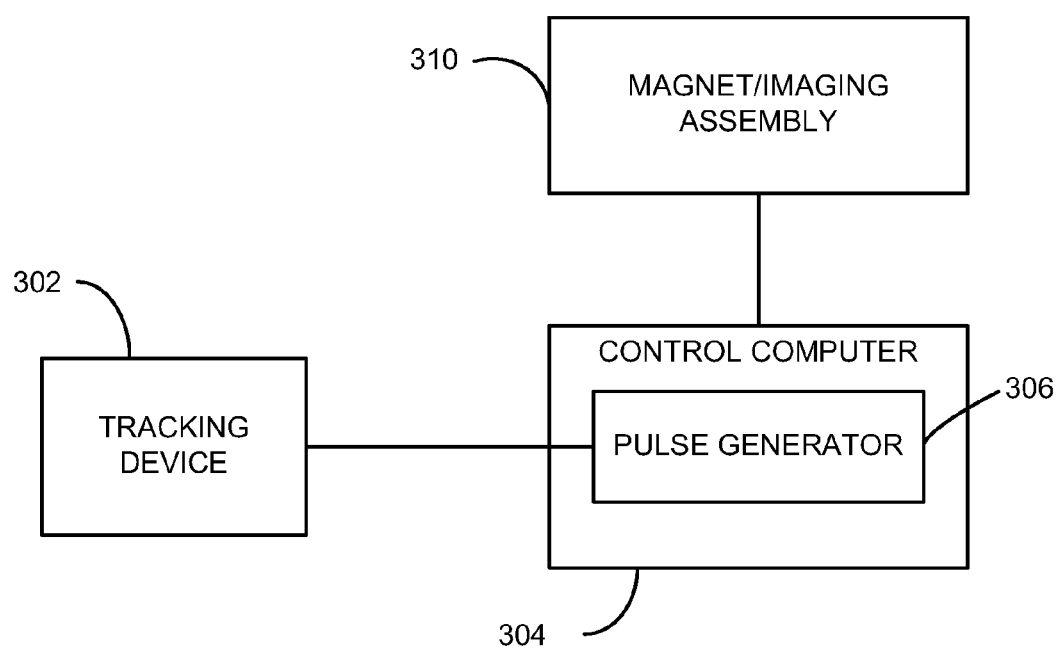
FIG. 3 is a schematic block diagram of a system for acquiring MRI data in accordance with an embodiment.

FIG. 3 is a schematic block diagram of a system for acquiring MR data in accordance with an embodiment. A tracking device 302 is coupled to a control computer 304 of an MRI system, for example, the MRI system 10 (shown in FIG. 1). The control computer 304 is coupled to a magnet/imaging assembly 310 which may include, for example, a magnet (not shown), a gradient coil assembly (not shown), an RF coils(s) (not shown) and an imaging volume (not shown).

Tracking device 302 may be used to detect the position and orientation of a target volume in an imaging subject (not shown) positioned within the imaging volume of the magnet/imaging assembly 310. The tracking device 302 may be external to the imaging subject or patient. The tracking device 302 may be configured to track the target volume's position and orientation throughout the MRI data acquisition period. Alternatively, the tracking device 302 may be configured to track the target volume's motion, which may be used in combination with an initial position and orientation of the target volume to calculate the target volume's position and orientation throughout the MRI data acquisition period. Alternatively, the tracking device 302 may track the positions of markers used to define the target volume throughout the MRI data acquisition period, which may be used to calculate the target volume's position and orientation. A requirement of the tracking device 302 is the ability to track the position and orientation of target volume with sufficient accuracy and temporal resolution to ensure that the target volume position and orientation used to encode each k-space line is an accurate representation of the position and orientation of the target volume at the time that the k-space line is acquired.

The tracking device 302 may be, for example, a system of two MRI compatible cameras that may be used to determine the position of a target volume using a stereo parallax method. In one embodiment, light-emitting diodes (LEDs) may be affixed to an imaging subject's head or body at the location of the target volume, and in a manner that provides a unique definition in space for the target volume. For example, a typical target volume may be an axial slab through the head at the location of the eyes. Three LEDs affixed to the head at the superior/inferior position of the eyes may be used to define an axial plane. The axial plane defines a center plane for the slab, and together with a slab thickness measurement, may be used to uniquely determine the slab in physical space. The cameras are used to obtain images or video of the subject throughout the MRI acquisition, and the images or video may be processed rapidly to provide the positions of the LEDs. By tracking the positions of these LEDs throughout the MRI data acquisition, a corresponding position and orientation for the target volume may be calculated. The camera system may include data processing elements that allow determination of a position and orientation of the target volume from the positions of the LEDs, or it may simply track the positions of the LEDs. In another embodiment, reflective elements may be used to define the target volume and a light source may be used to illuminate the reflective elements. The positions of the reflective elements may be tracked by the cameras in a similar manner as the LEDs. In yet another embodiment, features of the subject may be used as landmarks to define the target volume and the positions of the landmarks may be tracked by the cameras. In this embodiment, the images or video obtained by the cameras may be processed rapidly to provide information about the target volume's position and orientation by comparing the incoming images or video with a reference image defining the landmarks. While a two-camera tracking device is described above, the tracking device 302 may utilize other methods for determining position and orientation (or motion) of a target volume and include, for example, accelerometers, gyroscopes, magnets, lasers etc.

Current position and orientation information for the target volume (or quantities used to derive a current position and orientation of the target volume, for example, positions of markers, or quantities related to the motion of the target volume) is communicated from the tracking device 302 to the control computer 304 in real-time using a rapid data transfer method. This communication may occur via, for example, a serial communications link, a USB link, an optical fiber link, a wireless communication link or any other suitable communications link. The tracking device 302 may communicate directly with a pulse generator 306 or may communicate with pulse generator 306 via, for example, a physiological acquisition controller 44 (shown in FIG. 1). If the tracking device 302 provides measured quantities that are used to derive the position and orientation of the target volume, the pulse generator 306, or any other computing device in direct or indirect communication with the pulse generator 306, may be configured to derive the position and orientation from the measured quantities.

The pulse generator 306 uses the current position and orientation of the target volume to control acquisition parameters for each k-space line. Each position and orientation update is converted by the pulse generator 306 into an offset vector (in logical space) and a rotation matrix (describing the orientation of the logical space relative to the MRI scanner's coordinate system). The rotation matrix is used to modify the acquisition parameters to rotate the acquired slice or volume in physical space such that it tracks the target volume's orientation. The offset vector is used to modify the acquisition parameters such that the acquired slice or volume tracks the target volume's position.

Figure 4:
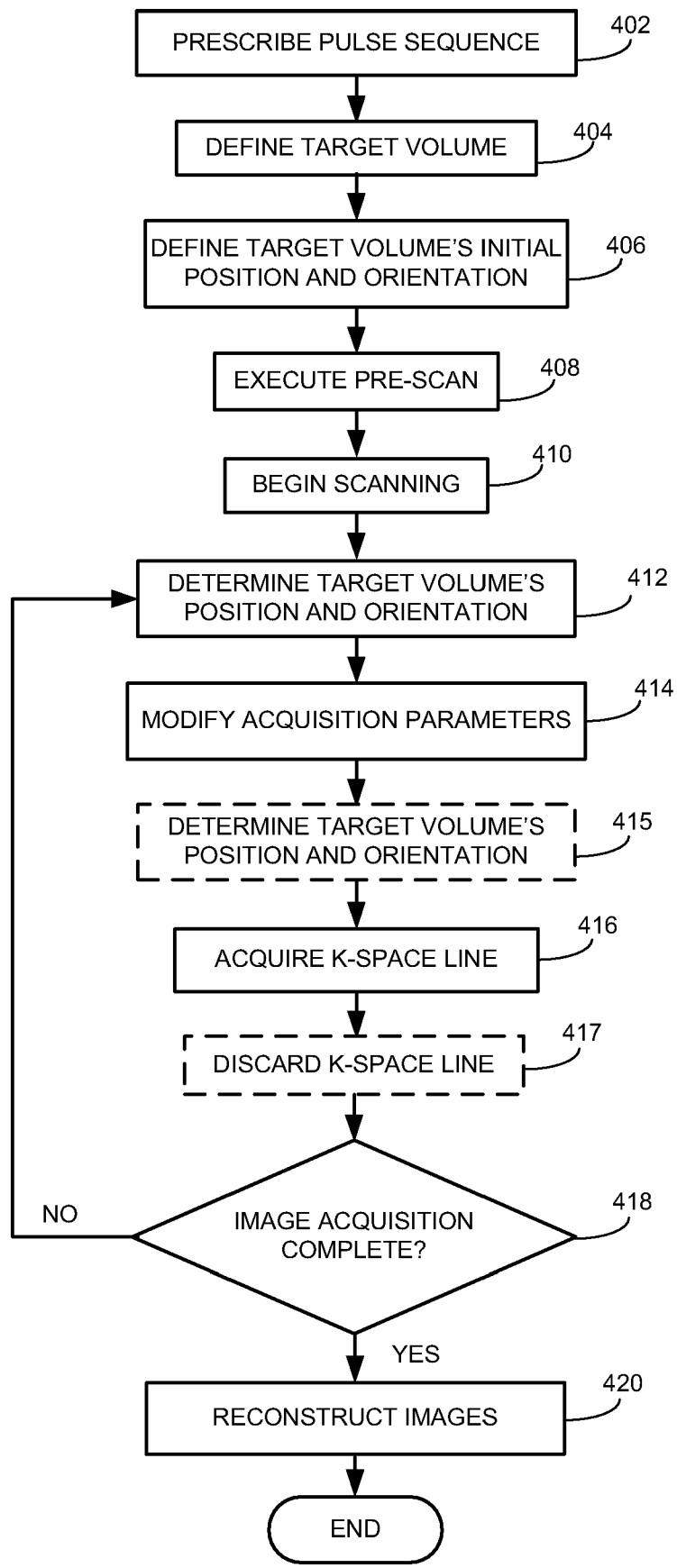
FIG. 4 is a flowchart showing a method for acquiring MRI data and generating an MR image in accordance with an embodiment.

FIG. 4 is a flowchart showing an exemplary method for acquiring MRI data and generating an MR image in accordance with an embodiment. At block 402, a scanner operator prescribes a pulse sequence for an imaging subject and any image acquisition parameters desired to tailor the pulse sequence for the particular patient and clinical indication. At block 404, the scanner operator defines a target volume in the imaging subject. The target volume may have dimensions of any ratio including a volume where all three dimensions are approximately equal or a volume where one dimension is much smaller than the other two (i.e., approximating a slice of finite thickness through the tissue). At block 406, the scanner operator defines the target volume's initial position and orientation. At block 408, a pre-scan routine is executed for the target volume. The pre-scan routine may include, for example, determining a center frequency, tuning the transmit coil, tuning the receive coil, calibrating the transmit gain, calibrating the receive gain, and "shimming" the main magnetic field to improve its homogeneity (i.e. small, spatially varying magnetic field increments or decrements may be added using special shimming coils). At block 410, scanning is started, i.e., the MRI scanner begins to play out the prescribed pulse sequence.

At block 412, the current position and orientation of the target volume is determined using a tracking device external to the imaging subject. As discussed above with respect to FIG. 3, the tracking device may utilize, for example, cameras, accelerometers, gyroscopes, magnets, lasers, etc. to measure the position and orientation of the target volume. The updated position and orientation of the target volume, or information related to the updated position and orientation of the target volume is communicated from the tracking device to the MR scanner (e.g., a pulse generator in the MR scanner) using a rapid data transfer method. Known methods are used to translate the position and orientation of the target volume, or the information related to the position and orientation of the target volume, into a rotation matrix and offset vector. At block 414, the offset vector and rotation matrix representing the current position and orientation of the target volume are used to modify acquisition parameters used by the MR scanner for acquisition of a k-space line. The rotation matrix may be used to directly modify the gradient waveforms to rotate the logical axes of the pulse sequence relative to the magnet's reference frame. For an offset in the slice direction, the transmit frequency for the excitation pulse may be modified. For example, the pulse generator 38 (shown in FIG. 1) may transmit a command to a frequency synthesizer 200 (shown in FIG. 2) to modify the transmit frequency in correspondence with a new slice location. For an offset in the phase direction, the pulse generator 38 (shown in FIG. 1) may transmit a command to the frequency synthesizer 200 (shown in FIG. 2) to modify the phase of the reference demodulation signal 201B (shown in FIG. 2). In an alternative embodiment, a position-related phase shift may instead be added digitally to the acquired signal to compensate for the offset in the phase-encoding direction. For example, a phase shift may be applied digitally to each k-space line prior to storage in a memory 66 (shown in FIG. 1) or each k-space line may be retrieved and modified after storage in memory 66. For an offset in the frequency-encoding direction, the frequency of the reference demodulation signal 201B (shown in FIG. 2) may be modified. For example, the pulse generator 38 (shown in FIG. 1) may transmit a command to a down converter 208 (shown in FIG. 2) to modify the frequency of the reference demodulation signal 201B (shown in FIG. 2).

Referring to FIG. 4, at block 415, a current position and orientation of the target volume may optionally be determined (preferably simultaneously) with the acquisition of a k-space line by the MR scanner at block 416 using the modified acquisition parameters determined at block 414. If a current position and orientation of the target volume was determined at block 415, a comparison may be made with the earlier determined current position and orientation of the target volume from block 412. If it is determined that sufficient motion has occurred between the two measurements to result in decreased image quality or motion artifact, the k-space line acquired at 416 may be discarded at block 417. This comparison may be made before acquiring the next line of k-space data, so that the same k-space line may be re-acquired after another measurement of a current position and orientation of the target volume at block 412. Alternatively, the comparison may be performed after acquisition of all k-space data for the image, and rejected k-space lines may be replaced by zero-filling, or some other partial k-space reconstruction technique may be used. At block 418, it is determined whether the image acquisition is complete, i.e., whether all the k-space lines necessary to complete an image have been acquired. If the image acquisition is not complete, the method returns to block 412 and the position and orientation of the target volume is determined using the tracking device. The acquisition parameters are then modified at block 414 based on the current position and orientation of the target volume at block 412 and the next line of k-space is acquired at block 416. Blocks 412 to 416 are repeated for each line of k-space data until all the k-space data has been acquired. Accordingly, a different rotation and offset vector may be used for each individual k-space line to track the motion of the target volume. At block 420, the k-space data is reconstructed to form an image. Reconstruction methods generally known in the art may be used to reconstruct the image.

In an alternative embodiment, the method of FIG. 4 may also be modified to acquire multiple k-space lines, i.e., a subset of the total number of k-space lines associated with the target volume, at block 416 using the same position and orientation of the target volume for the multiple k-space lines. Acquiring multiple lines of k-space at block 416 may be used for, for example, fast sequences such as Fast Spin Echo (FSE), or Gradient-and-Spin-Echo (GRASE) sequences. For these sequences, multiple lines of k-space are typically acquired in rapid succession. The position and orientation of the target volume is determined before the acquisition of each subset of k-space lines and may be used to determine the acquisition parameters for each k-space line in the subset if k-space lines. For example if a pulse sequence is configured to acquire a subset consisting of four k-space lines in rapid succession, the position and orientation of the target volume may be determined before the acquisition of each subset of four k-space lines. The position and orientation of the target volume during the acquisition of the multiple lines may be approximated using a single position and orientation measurement. The current position and orientation of the target volume may be used to modify the acquisition parameters used for the acquisition of the subset of k-space lines. Accordingly, the position and orientation of the target volume is determined for each subset of k-space lines.

While FIG. 4 describes a method using a two-dimensional pulse sequence to acquire a single MR image slice, it would be evident to those skilled in the art how to modify the method to acquire multiple slices, or a volume, or multiple volumes. In a volumetric acquisition, for example, the transmission frequency controls a slab location, and a second phase-encoding dimension is added.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

I claim:

1. A method for acquiring magnetic resonance data for a magnetic resonance image, the method comprising:

applying a magnetic field to a subject;

receiving an initial position and an initial orientation of a target volume in the subject;

determining a current position and a current orientation of the target volume before performing a portion of a pulse sequence corresponding to an acquisition of a single line of k-space data, wherein the current position and current orientation are determined using a tracking device;

modifying acquisition parameters for the portion of the pulse sequence using the current position and the current orientation of the target volume; and acquiring the line of k-space data.

2. A method according to claim 1, wherein the current position of the target volume comprises an offset vector and the current orientation of the target volume comprises a rotation matrix.

3. A method according to claim 2, wherein the offset vector comprises:

an offset along a slice direction;

an offset along a frequency-encoding direction; and an offset along a phase-encoding direction.

4. A method according to claim 1, wherein determining a current position and a current orientation of the target volume comprises:

measuring the current position and current orientation using a first format; and converting the current position and current orientation from the first format to a second format.

5. A method according to claim 4, wherein the second format comprises an offset vector and a rotation matrix.

6. A method according to claim 3, wherein modifying acquisition parameters comprises modifying a transmit frequency according to the offset along the slice direction.

7. A method according to claim 3, wherein modifying acquisition parameters comprises modifying a frequency of a reference demodulation signal according to the offset along the frequency-encoding direction.

8. A method according to claim 3, wherein modifying acquisition parameters comprises modifying a phase of a reference demodulation signal according to the offset along the phase-encoding direction.

9. A method according to claim 3, wherein modifying acquisition parameters comprises adding a phase to the line of k-space data according to the offset along the phase-encoding direction.

10. A method according to claim 3, wherein modifying acquisition parameters comprises rotating logical axes of a pulse sequence relative to a magnetic resonance imaging system's coordinate axes according to the rotation matrix.

11. A method according to claim 1, wherein determining a current position and a current orientation for the target volume comprises using a tracking device external to the subject.

12. A method according to claim 1, the method further comprising:

determining a current position and a current orientation for the target volume during the acquisition of the line of k-space data; and rejecting the line of k-space data if significant motion has occurred after modifying the acquisition parameters.

13. A method according to claim 1, wherein the magnetic resonance image is associated with a plurality of lines of k-space data, the method further comprising repeating for each line of k-space data in the plurality of lines of k-space data determining a current position and a current orientation and modifying acquisition parameters.

14. A method for acquiring magnetic resonance data for a magnetic resonance image, the method comprising:

applying a magnetic field to a subject;

receiving an initial position and an initial orientation of a target volume in the subject, the target volume associated with a plurality of lines of k-space data;

determining a current position and a current orientation of the target volume before performing a portion of a pulse sequence corresponding to an acquisition of a subset of lines of k-space data from the plurality of lines of k-space data, wherein the current position and current orientation are determined using a tracking device;

modifying acquisition parameters for the portion of the pulse sequence using the current position and the current orientation of the target volume; and acquiring the subset of lines of k-space data.

15. A computer-readable medium having computer-executable instructions for performing a method for acquiring magnetic resonance data for a magnetic resonance image, the computer-readable medium comprising:

program code for receiving an initial position and an initial orientation of a target volume in a subject;

program code for determining a current position and a current orientation of the target volume before performing a portion of a pulse sequence corresponding to an acquisition of a single line of k-space data, wherein the current position and current orientation are determined using a tracking device;

program code for modifying acquisition parameters for the portion of the pulse sequence using the current position and the current orientation of the target volume absent a standardized anatomical pattern; and program code for acquiring the line of k-space data.

16. A computer readable medium according to claim 15, wherein the updated position and updated orientation are in a first format, the computer readable medium further comprising program code for converting the updated position and updated orientation from the first format to a second format.

17. A computer readable medium according to claim 16, wherein the second format comprises an offset vector and a rotation matrix.

18. An apparatus for acquiring magnetic resonance data for a target volume in a subject, the target volume associated with a plurality of lines of k-space data, the apparatus comprising:

a pulse generator configured to receive a current position and a current orientation of the target volume before acquisition of each line of k-space data in the plurality of lines of k-space data, the acquisition of each line of k-space data performed in accordance with a portion of a pulse sequence having a set of acquisition parameters, the pulse generator further configured to modify the set of acquisition parameters based on the current position and current orientation of the target volume before acquisition of each line of k-space data, wherein the current position and current orientation are determined using a tracking device; and a magnetic resonance imaging assembly coupled to the pulse generator and configured to acquire each line of k-space data in accordance with the modified set of acquisition parameters corresponding to the line of k-space data.

19. An apparatus according to claim 18, further comprising a tracking device coupled to the pulse generator and configured to measure the current position and the current orientation of the target volume.

20. An apparatus according to claim 18, wherein the current position comprises an offset vector and the current orientation comprises a rotation matrix.

21. A method for acquiring magnetic resonance data for a magnetic resonance image, the method comprising:

applying a magnetic field to a subject;
receiving an initial position and an initial orientation of a target volume in the subject;
determining a current position and a current orientation of the target volume before performing a portion of a pulse sequence corresponding to an acquisition of a single line of k-space data;

modifying acquisition parameters for the portion of the pulse sequence using the current position and the current orientation of the target volume absent a standardized anatomical model; and
acquiring the line of k-space data.

* * * * *